United States Patent
Schuegraf

[11] Patent Number: 5,849,644
[45] Date of Patent: Dec. 15, 1998

[54] SEMICONDUCTOR PROCESSING METHODS OF CHEMICAL VAPOR DEPOSITING SIO₂ ON A SUBSTRATE

[75] Inventor: Klaus F. Schuegraf, Boise, Id.

[73] Assignee: Micron Technology, Inc., Boise, Id.

[21] Appl. No.: 696,243

[22] Filed: Aug. 13, 1996

[51] Int. Cl.⁶ .................................................. H01L 21/316
[52] U.S. Cl. ........................................................... 438/790
[58] Field of Search .................................. 437/235, 238, 437/241; 438/778, 784, 790, 789

[56] References Cited

U.S. PATENT DOCUMENTS

| | | | |
|---|---|---|---|
| 5,182,221 | 1/1993 | Sato | 437/67 |
| 5,360,646 | 11/1994 | Morita | 427/574 |
| 5,420,075 | 5/1995 | Homma et al. | 437/195 |
| 5,462,899 | 10/1995 | Ikeda | 437/238 |
| 5,470,800 | 11/1995 | Muroyama | 437/238 |
| 5,472,913 | 12/1995 | Havemann et al. | 437/238 |
| 5,580,822 | 12/1992 | Hayakawa et al. | 437/187 |
| 5,610,105 | 3/1997 | Vines et al. | 437/238 |
| 5,710,079 | 1/1998 | Sukharev | 438/778 |
| 5,736,018 | 6/1998 | Sato | 438/790 |

OTHER PUBLICATIONS

S. Wolf et al. "Terminology of CVD Reactor Design", Silicon Processing for the VLSI ERA, vol. 1, pp. 166–168 1986.

IslamRaja, et al., "Two Precursor Model for Low–Pressure Chemical Vapor Deposition Of Silicon Dioxode From Tetrethylorthosilicate", J. Vac. Sci. Technol. B, vol. 11, No. 3, May/Jun. 1993, pp. 720–726.

Crowell, John E. et al., "The Chemical Vapor Deposition of SiO₂ From TEOS", Journal of Electron Spectroscopy And Related Phenomena, 54/55 (1990) pp. 1097–1104.

Haupfear, E.A. et al., "Kinetics of SiO₂ Deposition From Tetraethylorthosilicate", Electrochem. Soc. vol. 141, No. 7, Jul. 1994, pp. 1943–1950.

Wolf, Stanley, Silicon Processing for the VLSI Era, vol. 1, pp. 166–171, 1986.

*Primary Examiner*—Charles Bowers
*Assistant Examiner*—Matthew Whipple
*Attorney, Agent, or Firm*—Wells, St. John, Roberts, Gregory & Matkin, P.S.

[57] ABSTRACT

The invention provides semiconductor processing methods of depositing SiO₂ on a substrate. In a preferred aspect, the invention provides methods of reducing the formation of undesired reaction intermediates in a chemical vapor deposition (CVD) decomposition reaction. In one implementation, the method is performed by feeding at least one of $H_2O$ and $H_2O_2$ into a reactor with an organic silicon precursor. For example, in one exemplary implementation, such components are, in gaseous form, fed separately into the reactor. In another exemplary implementation, such components are combined in liquid form prior to introduction into the reactor, and thereafter rendered into a gaseous form for provision into the reactor. The invention can be practiced with or in both hot wall and cold wall CVD systems.

22 Claims, 2 Drawing Sheets

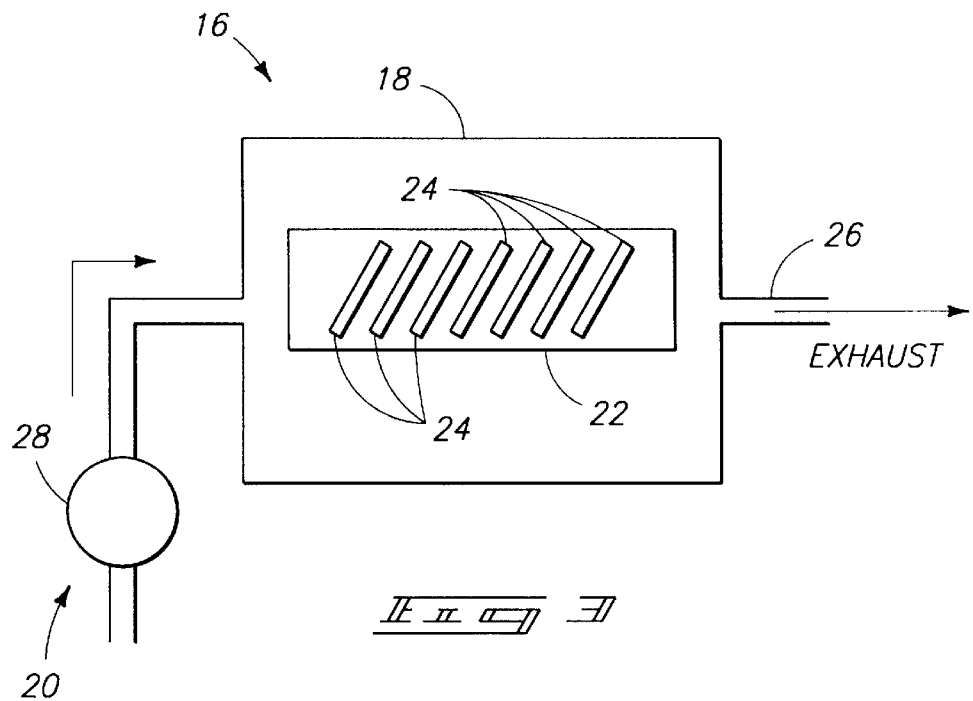
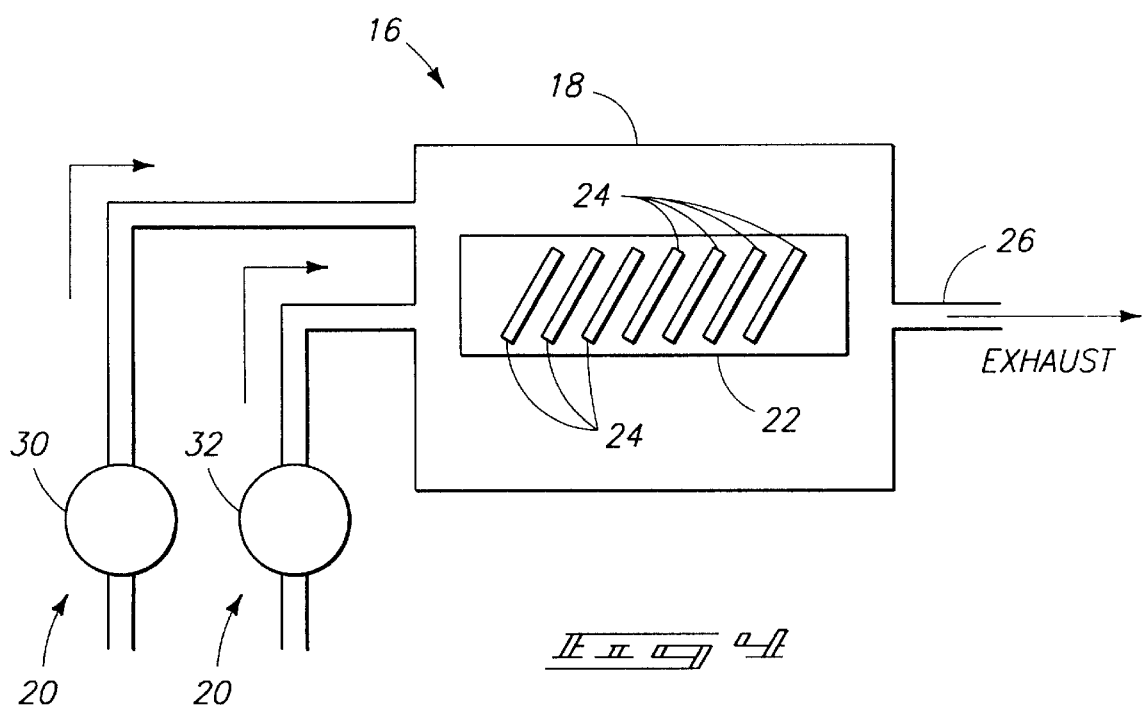

5,849,644

SEMICONDUCTOR PROCESSING METHODS OF CHEMICAL VAPOR DEPOSITING SiO₂ ON A SUBSTRATE

TECHNICAL FIELD

This invention relates to semiconductor processing methods of chemical vapor depositing $SiO_2$ on a substrate.

BACKGROUND OF THE INVENTION

Chemical vapor deposited (CVD) $SiO_2$ films and their binary and ternary silicates find wide use in VLSI processing. These materials find use as insulators between polysilicon and metal layers, between metal layers in multilevel metal systems, as diffusion sources, as diffusion and implantation masks, as capping layers to prevent outdiffusion, and as final passivation layers.

The manner in which a thin film covers or conforms to the underlying features on a substrate is an important characteristic in semiconductor processing. Conformal coverage refers to coverage in which equal film thickness exists over all substrate topography regardless of its slope, i.e. vertical and horizontal substrate surfaces are coated with equal film thickness.

One manner of effecting the deposition of $SiO_2$ on a substrate is through pyrolysis of an organic silicon precursor in a CVD reactor to form $SiO_2$. A typical organic silicon precursor is tetraethoxysilane or TEOS which is represented by the chemical formula $Si(OC_2H_5)_4$. A typical reactor used to effect the pyrolysis of organic silicon precursors is a low pressure CVD reactor or LPCVD reactor. LPCVD reactors include both hot wall and cold wall reactors. In hot wall reactors, wafers can be heated utilizing radiant heat supplied from resistance-heated coils. In cold wall reactors, wafers can be heated utilizing infrared lamps or rf induction.

LPCVD reactors are typically operated at pressures of around 0.25–2.0 Torr and temperatures of around 550° C. to 800° C., although such parameters may vary depending on a number of different conditions including the particular types of reactants used. The stoichiometry of decomposition of TEOS within an LPCVD reactor may be simplistically written as:

$Si(OC_2H_5)_4 \rightarrow SiO_2 + 4C_2H_4 + H_2O_2$

Typically, however, intermediates are formed in the above reaction which include di-ethoxysilane $(Si(OC_2H_5)_3OH)$ and tri-ethoxysilane $(Si(OC_2H_5)_2(OH)_2)$. Further, other reaction by-products are formed.

One problem facing the semiconductor wafer processor is achieving adequate and conformal step coverage of deposited $SiO_2$ into very deep and narrow contact openings or other so-called high aspect ratio topographies. One such substrate surface topography is depicted in FIGS. 1 and 2 and designated generally by reference numeral 10. Topography 10 is defined by a deep trench 12 into which an $SiO_2$ layer 14 has been deposited as by CVD of a suitable organic silicon precursor such as TEOS.

FIG. 1 illustrates a situation in which adequate conformality has been achieved as evidenced by the uniformity or substantial uniformity in thickness of layer 14 over the substrate surface, and particularly within trench 12. FIG. 2 illustrates a situation in which inadequate conformality has resulted in non-uniformity in the thickness of layer 14, particularly at and near the bottom of trench 12. Such is an undesirable condition.

One source of inadequate conformality of $SiO_2$ on a substrate surface is premature formation of undesirable intermediates which react to form $SiO_2$ at higher topographical elevations on a substrate surface. Consequently, such intermediates never reach the bottom of a particular substrate feature, such as trench 12 of FIG. 2, so that lesser degrees of $SiO_2$ are formed thereon.

One method to improve step coverage has been to increase pressures in the CVD reactor. By doing so, the partial pressure of the organic silicon precursor, such as TEOS, is increased, while the partial pressure of the intermediates is not. The increase in organic silicon precursor partial pressure results in improved step coverage because the precursor has a more favorable sticking coefficient as compared with the intermediates.

Another attempt to increase step coverage has been to introduce ethylene $(C_2H_4)$ into the reactor with the precursor to inhibit the premature formation of intermediates. Unfortunately, great success has not been achieved due to significant degradation of deposition rates stemming from competitive absorption relative to the substrate surface as between the ethylene and the precursor.

This invention grew out of the need to provide improved step coverage of LPCVD $SiO_2$ over high aspect ratio substrate topography.

SUMMARY OF THE INVENTION

The invention provides semiconductor processing methods of depositing $SiO_2$ on a substrate.

In a preferred aspect, the invention provides methods of reducing the formation of undesired reaction intermediates in a chemical vapor deposition (CVD) decomposition reaction. In one implementation, the method is performed by feeding at least one of $H_2O$ and $H_2O_2$ into a reactor with an organic silicon precursor. For example, in one exemplary implementation, such components are, in gaseous form, fed separately into the reactor. In another exemplary implementation, such components are combined in liquid form prior to introduction into the reactor, and thereafter rendered into a gaseous form for provision into the reactor. The invention can be practiced with or in both hot wall and cold wall CVD systems.

BRIEF DESCRIPTION OF THE DRAWINGS

Preferred embodiments of the invention are described below with reference to the following accompanying drawings.

FIG. 3 is a schematic diagram of a chemical vapor deposition system which may be used in conjunction with one preferred aspect of the invention.

FIG. 4 is a schematic diagram of a chemical vapor deposition system which may be used in conjunction with another preferred aspect of the invention.

DETAILED DESCRIPTION OF THE PREFERRED EMBODIMENTS

Figure 1:
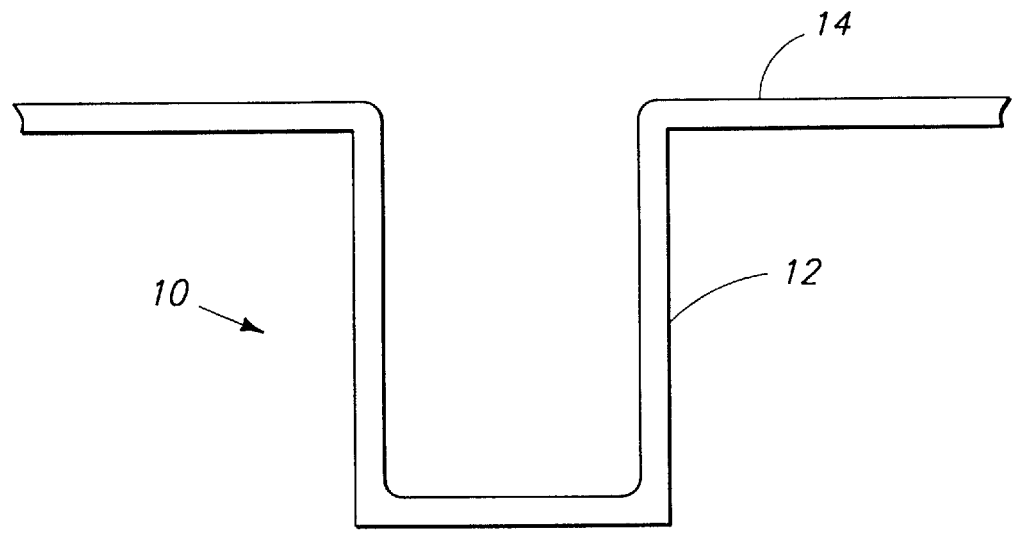
FIG. 1 illustrates a so-called high aspect ratio semiconductor topography in the form of a trench into which silicon dioxide has been deposited achieving adequate conformal coverage.
Figure 2:
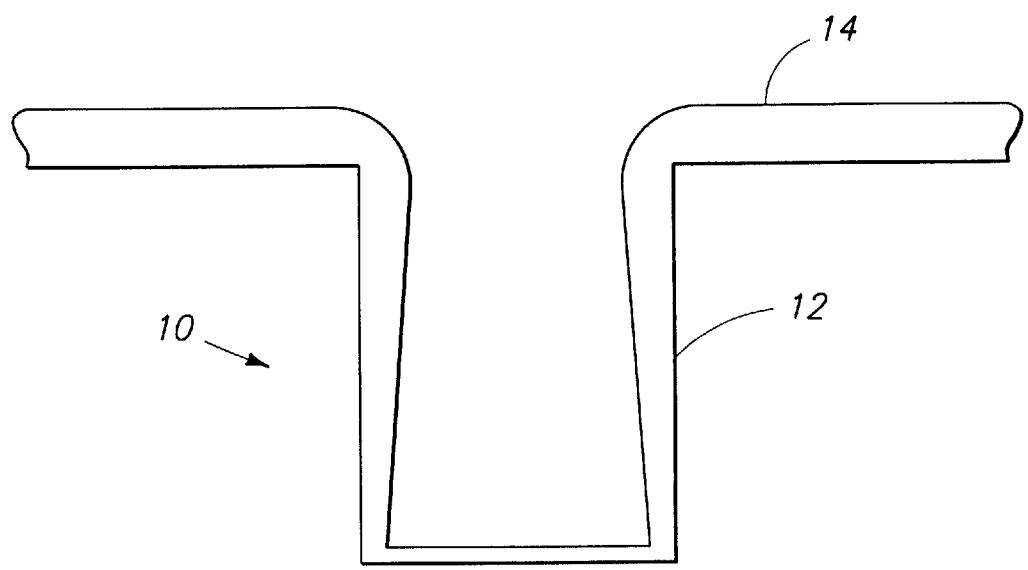
FIG. 2 illustrates a high aspect ratio semiconductor topography similar to FIG. 1, only one in which inadequate conformal coverage has been achieved.

This disclosure of the invention is submitted in furtherance of the constitutional purposes of the U.S. Patent Laws "to promote the progress of science and useful arts" (Article 1, Section 8).

In accordance with one aspect of the invention, a semiconductor processing method of chemical vapor depositing $SiO_2$ on a substrate comprises:

placing a substrate within a chemical vapor deposition reactor;

feeding an organic silicon precursor into the chemical vapor deposition reactor having the substrate positioned therein under conditions effective to decompose the precursor into $SiO_2$ which deposits on the substrate and into a gaseous oxide of hydrogen; and feeding an additional quantity of the gaseous oxide of hydrogen into the reactor while feeding the organic silicon precursor to the reactor.

In accordance with another aspect of the invention, a semiconductor processing method of reducing the decomposition rate of an organic silicon precursor in a chemical vapor deposition process of depositing $SiO_2$ on a substrate within a chemical vapor deposition reactor comprises feeding at least one of $H_2O$ and $H_2O_2$ into the reactor while feeding the organic silicon precursor.

In accordance with another aspect of the invention, a semiconductor processing method of chemical vapor depositing $SiO_2$ on a substrate comprises:

placing a substrate within a chemical vapor deposition reactor; and feeding an organic silicon precursor and feeding an oxide of hydrogen into the chemical vapor deposition reactor having the substrate positioned therein under conditions effective to deposit an $SiO_2$ layer on the substrate.

In accordance with another aspect of the invention, a semiconductor processing method of reducing the formation of undesired reaction intermediates in a chemical vapor deposition decomposition reaction of an organic silicon precursor into silicon dioxide within a chemical vapor deposition reactor comprises feeding at least one of $H_2O$ and $H_2O_2$ into the reactor with the organic silicon precursor.

FIGS. 3 and 4 show schematic diagrams of a different chemical vapor deposition (CVD) systems both of which are designated at 16. The preferred semiconductor processing methods may be carried out in either system in accordance with the description below. The system of FIG. 3 is configured slightly differently from the system of FIG. 4 as will become apparent below. Preferably, CVD systems 16 are low pressure chemical vapor deposition (LPCVD) hot wall systems, although other CVD systems, such as cold wall systems can be used as will become apparent. The illustrated and preferred hot wall systems 16 include a CVD reactor 18 which is configured to carry out depositions at temperatures between around 640° C. to 900° C., and at pressures between 100 mTorr to 3 Torr. Various gases can be supplied to reactor 18 from one or more gas sources or bubblers, such as those shown at 20. Such gas sources or bubblers typically hold or contain a liquid mixture which is heated to produce a gas. Such gas from gas sources 20 enters CVD reactor 18 where exposure to temperature and pressure conditions effect deposition of a material, preferably $SiO_2$, on a semiconductor or wafer substrate therewithin. More than one gas source (FIG. 4) may be used. Inside of CVD reactor 18, a semiconductor wafer holder 22 is provided for holding a plurality of semiconductor wafers or substrates 24. After suitable deposition has occurred, gaseous by-products are exhausted, together with unused reactant and/or diluent gases through exhaust port 26. Reactant gases may be carried by inert diluent or carrier gases such as $H_2$, $N_2$ or Ar.

FIG. 3 shows system 16 configured for carrying out one preferred semiconductor processing method of chemical vapor depositing $SiO_2$ on a substrate. Accordingly, system 16 includes a gas source 28. An example of a suitable gas source is a bubbler which contains liquid reactants which are subsequently converted into a gas for provision into a reactor, such as reactor 18. The illustrated and preferred method includes placing a substrate or substrates, such as those shown at 24, within a chemical vapor deposition reactor, such as reactor 18. Reactants which are held in gas source 28 are then heated to produce a gas which is supplied to reactor 18 for further processing in accordance this method. One such reactant is a suitable organic silicon precursor which is preferably tetraethoxysilane or TEOS. Such precursor is fed into reactor 18 wherein substrate 24 is positioned under processing conditions, such as the temperature and pressure conditions mentioned above, which are effective to decompose the precursor into $SiO_2$. Although the preferred methods are described as utilizing TEOS as the preferred organic silicon precursor, other such organic silicon precursors may be used. Other precursors include: silane, diethylsilane (DES), tetramethylcyclo-tetrasiloxane (TMCTS), fluorotriethoxysilane (FTES), and fluorotrialkoxysilane (FTAS). The $SiO_2$ deposits on substrates 24 and preferably into high-aspect topography features such as trench 12 in FIG. 1. The organic silicon precursor also decomposes into a gaseous oxide of hydrogen such as $H_2O$ and $H_2O_2$. According to a preferred aspect of the invented method, another reactant, preferably either $H_2O$ or $H_2O_2$, is provided in liquid form in gas source 28. Such additional quantity of the oxide of hydrogen is fed into reactor 18 in gaseous form, while feeding the organic silicon precursor into the reactor. The presence of the additional quantity of the gaseous oxide of hydrogen shifts the reaction equilibrium in the direction of the reactants, thus increasing the partial pressure of the organic silicon precursor. Such inhibits or reduces premature formation of undesirable intermediates which heretofore have reduced the conformality of the deposition process.

Referring still to FIG. 3, quantities of TEOS and the additional quantity of the oxide of hydrogen, both in liquid form, are mixed together to form a liquid mixture. The liquid mixture formed thereby is then converted to a gaseous mixture which is thereafter fed into reactor 18. By first combining liquid forms of the oxide of hydrogen and the organic silicon precursor, and then feeding the gaseous mixture produced thereafter into the reactor, the organic silicon precursor and the additional gaseous quantity of the oxide of hydrogen are fed into the reactor together. Preferably, the quantity of organic silicon precursor, in this example TEOS, in the liquid mixture is greater by volume than the quantity of the oxide of hydrogen. Even more preferably, the liquid mixture volume comprises between about 5% to 15% of the oxide of hydrogen. Volumes of the oxide of hydrogen less than about 5% can be utilized to achieve the above-described advantages. Volumes of about 0.5% or lower of either of the oxides of hydrogen may also be utilized. Conversion of the liquid mixture to the gaseous mixture preferably takes place at bubbler temperatures between about 65° to 80° C. with a preferred temperature of about 75° C. Thereafter, the gaseous mixture is fed into reactor 18 where it is reacted to deposit $SiO_2$ on substrates 24 therewithin.

The above described method is one in which the organic silicon precursor and the oxide of hydrogen are first mixed in liquid form to form a liquid mixture. The liquid mixture is then subjected to conditions effective to convert it into a gas which is thereafter fed into the illustrated and preferred hot wall CVD reactor for subsequent deposition processing at temperatures between around 640° C. to 900° C. The gaseous mixture is fed into the reactor from a common feed stream.

The above described method can also be employed in cold wall LPCVD systems under the following preferred pressure, temperature and other relevant operating conditions. Cold wall deposition conditions or parameters include pressure conditions of around 10 Torr up to an upper limit of around 80 Toor. A preferred temperature for cold wall processing is around 400° C. with rf plasma power at 600 W. Further, in accordance with this aspect of the invention, $O_2$ and He flows respectively, are at 600 sccm and 775 sccm. The preferred organic precursor is TEOS which is delivered by liquid injection at 975 sccm. Additionally, a wafer gap to susceptor is around 230 mils. Under the above conditions, a resulting $SiO_2$ deposition rate of around 7000 Angstroms/min is possible.

FIG. 4 illustrates schematically a CVD system in which two gas sources or bubblers 30, 32 are shown. Preferably, one of the gas sources contains the organic silicon precursor, preferably TEOS, and the other gas source contains the additional quantity of the oxide of hydrogen, either of $H_2O$ and/or $H_2O_2$. In such system, reactor 18 is separately fed with such gaseous reactants. A preferred concentration of gaseous material provided into reactor 18 comprises less than about 50% by volume of the $H_2O$ and/or $H_2O_2$. Even more preferably, the volume of material injected into the reactor comprises between about 5% to 15% by volume of the $H_2O$ and/or $H_2O_2$. Quantities of $H_2O$ and $H_2O_2$ less than about 5% of the volume of material injected into the reactor may be utilized to achieve the above-described advantages. Volumes of about 0.5% or lower of either of the oxides of hydrogen can reduce the decomposition rate of the organic silicon precursor sufficiently to allow CVD depositing of $SiO_2$ on a silicon substrate.

The above described method is one in which the reactants are provided in separate bubblers or gas sources, and subjected to conditions effective to convert each to a separate gas. Each separate gas is then separately fed into the reactor and exposed to temperature and pressure conditions effective to deposit an $SiO_2$ layer on the wafers or substrates held therewithin. The gaseous mixtures are fed into the reactor from separate feed streams. As in the first-described method, the above described method may be utilized in cold wall LPCVD systems under conditions which are the same as or similar to those mentioned above.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

I claim:

1. A semiconductor processing method of chemical vapor depositing $SiO_2$ on a substrate comprising:
   placing a substrate within a low pressure chemical vapor deposition reactor;
   feeding an organic silicon precursor into the low pressure chemical vapor deposition reactor having the substrate positioned therein under conditions effective to decompose the precursor into $SiO_2$ which deposits on the substrate and into a gaseous oxide of hydrogen, said conditions comprising deposition temperatures of between around 640° C. to 900° C.; and
   feeding an additional quantity of the gaseous oxide of hydrogen into the low pressure chemical vapor deposition reactor while feeding the organic silicon precursor into the reactor, wherein said feeding steps collectively comprise:
   mixing a quantity of the organic silicon precursor in liquid form and a quantity of the oxide of hydrogen in liquid form to form a liquid mixture;
   converting the liquid mixture to a gaseous mixture; and
   feeding the gaseous mixture into the reactor.

2. The semiconductor processing method of claim 1, wherein the organic silicon precursor and the additional quantity of the gaseous oxide of hydrogen are fed into the reactor from a common feed stream.

3. The semiconductor processing method of claim 1, wherein the quantity of the organic silicon precursor is greater by volume than the quantity of the oxide of hydrogen.

4. The semiconductor processing method of claim 1, wherein the quantity of the oxide of hydrogen comprises between about 5%–15% of the liquid mixture volume.

5. The semiconductor processing method of claim 1, wherein the converting step includes heating the liquid mixture to a temperature of between about 65° C. to 80° C.

6. The semiconductor processing method of claim 1, wherein the quantity of the organic silicon precursor is greater by volume than the quantity of the oxide of hydrogen and the converting step includes heating the liquid mixture to a temperature of between about 65° C. to 80° C.

7. The semiconductor processing method of claim 1, wherein the quantity of the oxide of hydrogen comprises between about 5%–15% of the liquid mixture volume and the converting step includes heating the liquid mixture to a temperature of between about 65° C. to 80° C.

8. The semiconductor processing method of claim 1 wherein the organic silicon precursor is selected from the group consisting of: tetraethoxysilane (TEOS), diethylsilane (DES), tetramethylcyclo-tetrasiloxane (TMCTS), and fluorotrialkoxysilane.

9. The semiconductor processing method of claim 1, wherein the chemical vapor deposition reactor is a hot wall reactor.

10. The semiconductor processing method of claim 1, wherein the chemical vapor deposition reactor is a cold wall reactor.

11. The semiconductor processing method of claim 1, wherein the gaseous oxide of hydrogen comprises $H_2O$ and the chemical vapor deposition reactor comprises a low pressure chemical vapor deposition reactor, said feeding taking place under deposition temperatures between around 640° C. to 900° C. sufficient to form a layer of $SiO_2$ over the substrate.

12. The semiconductor processing method of claim 1, wherein the gaseous oxide of hydrogen comprises $H_2O_2$.

13. A semiconductor processing method of reducing the decomposition rate of an organic silicon precursor in a chemical vapor deposition process of depositing $SiO_2$ on a substrate within a chemical vapor deposition reactor comprising feeding at least one of $H_2O$ and $H_2O_2$ into the reactor while feeding the organic silicon precursor wherein the feeding steps collectively comprise:
   mixing a quantity of the organic silicon precursor in liquid form and a quantity of the at least one of $H_2O$ and $H_2O_2$ in liquid form to form a liquid mixture;
   converting the liquid mixture to a gaseous mixture; and
   feeding the gaseous mixture into the reactor.

14. The semiconductor processing method of claim 13, wherein the liquid mixture comprises no less than about 0.5% by volume of the at least one of $H_2O$ and $H_2O_2$.

15. The semiconductor processing method of claim 13, wherein the liquid mixture comprises between about 5% to 15% by volume of the at least one of $H_2O$ and $H_2O_2$.

16. The semiconductor processing method of claim 13, wherein only $H_2O$ is fed into the reactor while feeding the organic silicon precursor.

17. The semiconductor processing method of claim 13, wherein only $H_2O_2$ is fed into the reactor while feeding the organic silicon precursor.

18. A semiconductor processing method of chemical vapor depositing $SiO_2$ on a substrate comprising:

placing a substrate within a chemical vapor deposition reactor; and feeding an organic silicon precursor and feeding an oxide of hydrogen into the chemical vapor deposition reactor having the substrate positioned therein under conditions effective to deposit an $SiO_2$ layer on the substrate, wherein the feeding steps collectively comprise:

mixing a quantity of the organic silicon precursor in liquid form and a quantity of the oxide of hydrogen in liquid form to form a liquid mixture, the liquid mixture comprising less than about 15% by volume of the oxide of hydrogen;

heating the liquid mixture to a temperature sufficient to produce a gas containing at least some organic silicon precursor and at least some oxide of hydrogen; and feeding the produced gas into the reactor.

19. The semiconductor processing method of claim 18, wherein the oxide of hydrogen comprises $H_2O$.

20. The semiconductor processing method of claim 18, wherein the oxide of hydrogen comprises $H_2O_2$.

21. A semiconductor processing method of chemical vapor depositing $SiO_2$ on a substrate comprising:

placing a substrate within a chemical vapor deposition reactor;

mixing a quantity of an organic silicon precursor in liquid form and a quantity of an oxide of hydrogen in liquid form to form a liquid mixture, the organic silicon precursor being selected from the group consisting of: tetraethoxysilane (TEOS), diethylsilane (DES), tetramethylcyclo-tetrasiloxane (TMCTS), and fluorotrialkoxysilane, the oxide of hydrogen comprising $H_2O$, the quantity of the oxide of hydrogen comprising between about 5%–15% of the liquid mixture volume;

converting the liquid mixture to a gaseous mixture by heating the liquid mixture to a temperature of between about 65° C. to 80° C.; and feeding the gaseous mixture into the reactor.

22. A semicondutor processing method of chemical vapor depositing $SiO_2$ on a substrate comprising:

placing a substrate within a chemical vapor deposition reactor;

mixing a quantity of an organic silicon precursor in liquid form and a quantity of an oxide of hydrogen in liquid form to form a liquid mixture, the organic silicon precursor being selected from the group consisting of: tetraethoxysilane (TEOS), diethylsilane (DES), tetramethylcyclo-tetrasiloxane (TMCTS), and fluorotrialkoxysilane, the oxide of hydrogen comprising $H_2O_2$, the quantity of the oxide of hydrogen comprising between about 5%–15% of the liquid mixture volume;

converting the liquid mixture to a gaseous mixture including heating the liquid mixture to a temperature a between about 65° C. to 80° C.; and feeding the gaseous mixture into the reactor.

* * * * *